(12) United States Patent
Son et al.

(10) Patent No.: US 12,256,604 B2
(45) Date of Patent: Mar. 18, 2025

(54) DISPLAY DEVICE

(71) Applicant: Samsung Display Co., Ltd., Yongin-si (KR)

(72) Inventors: Jong Ho Son, Yongin-si (KR); Young Gu Kim, Yongin-si (KR); Ji Yun Park, Yongin-si (KR); Duck Jong Suh, Yongin-si (KR); Bong Sung Seo, Yongin-si (KR); Yeon Hee Lee, Yongin-si (KR); Baek Kyun Jeon, Yongin-si (KR); Kyung Seon Tak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 747 days.

(21) Appl. No.: 17/444,396

(22) Filed: Aug. 4, 2021

(65) Prior Publication Data

US 2022/0165816 A1 May 26, 2022

(30) Foreign Application Priority Data

Nov. 26, 2020 (KR) .................. 10-2020-0161574

(51) Int. Cl.
*H01L 27/32* (2006.01)
*H10K 59/122* (2023.01)
*H10K 59/38* (2023.01)

(52) U.S. Cl.
CPC ........... *H10K 59/122* (2023.02); *H10K 59/38* (2023.02)

(58) Field of Classification Search
CPC .. H10K 59/122; H10K 59/38; H01L 25/0753; H01L 25/167; H01L 27/1214; G02B 5/201
See application file for complete search history.

(56) References Cited

U.S. PATENT DOCUMENTS

| | | |
|---|---|---|
| 8,789,340 B2 | 7/2014 | Dixon et al. |
| 8,908,128 B2 * | 12/2014 | Takahashi ......... G02F 1/133516 349/110 |
| 10,516,134 B2 | 12/2019 | Ochi et al. |
| (Continued) | | |

FOREIGN PATENT DOCUMENTS

| | | |
|---|---|---|
| KR | 10-2018-0136082 A | 12/2018 |
| KR | 10-2020-0046221 A | 5/2020 |

*Primary Examiner* — Cuong B Nguyen
(74) *Attorney, Agent, or Firm* — Womble Bond Dickinson (US) LLP

(57) ABSTRACT

A display device includes a substrate. The substrate includes a display area and a non-display area, and the display area includes an emission area and a non-emission area. A display element layer includes a light emitting element on the emission area of the substrate. A bank is on the display element layer and overlaps the non-display area and the non-emission area of the substrate in a plan view. A color conversion layer is on the display element layer, overlaps the emission area in the plan view, and is to convert a color of light emitted from the light emitting element. An organic insulating layer is on the color conversion layer and the bank. A maximum thickness of the bank is about 4 µm to about 20 µm. An average inclination angle of a first side surface of the bank adjacent to an edge of the substrate in the non-display area based on an upper surface of the substrate is less than or equal to about 45 degrees.

15 Claims, 10 Drawing Sheets

(56) References Cited

U.S. PATENT DOCUMENTS

| | | |
|---|---|---|
| 10,608,058 B2 | 3/2020 | Gwon et al. |
| 11,637,217 B2 * | 4/2023 | Lin .................... H01L 33/0095 438/22 |
| 2020/0127220 A1 | 4/2020 | Kim et al. |

* cited by examiner

DISPLAY DEVICE

CROSS-REFERENCE TO RELATED APPLICATION

The application claims priority to and the benefit of Korean Patent Application No. 10-2020-0161574, filed Nov. 26, 2020, the entire content of which is hereby incorporated by reference.

BACKGROUND

1. Field

The present disclosure relates to a display device.

2. Description of Related Art

With increasing interest in information display and increasing demand for use of portable information media, demand for display devices and the commercialization of display devices has increased.

SUMMARY

An aspect of embodiments of the present disclosure is directed towards a display device capable of preventing or reducing cracks (e.g., a display device with reduced cracking).

In order to achieve the aspect of embodiments of the present disclosure, a display device according to an embodiment of the present disclosure may include a substrate including a display area, the display area including an emission area and a non-emission area, and a non-display area; a display element layer including a light emitting element on the emission area of the substrate; a bank on the display element layer and overlapping the non-display area and the non-emission area of the substrate in a plan view; a color conversion layer on the display element layer, overlapping the emission area in the plan view, and to convert a color of light emitted from the light emitting element; and an organic insulating layer on the color conversion layer and the bank. A maximum thickness of the bank may be about 4 μm to about 20 μm, and an average inclination angle of a first side surface of the bank adjacent to an edge of the substrate in the non-display area based on an upper surface of the substrate may be less than or equal to about 45 degrees.

In an embodiment, an inclination angle at a first point of the first side surface of the bank having a thickness greater than or equal to about ½ of the maximum thickness may be less than or equal to about 45 degrees.

In an embodiment, the inclination angle at a second point of the first side surface of the bank having a thickness less than about ½ of the maximum thickness may be greater than about 45 degrees.

In an embodiment, the inclination angle at a second point of the first side surface of the bank having a thickness less than about ½ of the maximum thickness may be less than or equal to about 45 degrees.

In an embodiment, the inclination angle of the first side surface may increase as a distance to the first point decreases and may decrease as the distance from the first point increases.

In an embodiment, the organic insulating layer may cover the bank, and only the organic insulating layer may be between the bank and the edge of the substrate in a direction parallel to the upper surface of the substrate.

In an embodiment, a size of a rate of change in thickness of the organic insulating layer along an inclined direction of the first side surface in the non-display area may be less than or equal to about 1, and the thickness of the organic insulating layer may be a distance between upper and lower surfaces of the organic insulating layer in a direction normal (e.g., perpendicular) to the upper surface of the substrate.

In an embodiment, the bank may have slits formed on the first side surface along a second direction, and the second direction may be perpendicular to a first direction, the first direction being from the first side surface of the bank to an adjacent side of the substrate.

In an embodiment, the slits may be formed in a section of the bank in which a thickness of the bank is less than about ½ of the maximum thickness.

In an embodiment, the bank may have an opening corresponding to the emission area in the display area, and an inclination angle of a second side surface of the bank forming the opening may be greater than about 45 degrees.

In an embodiment, the color conversion layer may be provided in the opening of the bank and cover the second side surface of the bank.

In an embodiment, the organic insulating layer may not contact the second side surface in the display area.

In an embodiment, the display device may further include a color filter provided in the opening between the color conversion layer and the organic insulating layer.

In an embodiment, the display element layer may further include a bank pattern defining the emission area, and the bank may completely overlap the bank pattern in the plan view in the display area.

In an embodiment, the display element layer may further include a passivation layer covering the light emitting element and the bank pattern, and the bank may be on the passivation layer.

BRIEF DESCRIPTION OF THE DRAWINGS

The accompanying drawings, which are included to provide a further understanding of the present disclosure, and are incorporated in and constitute a part of this specification, illustrate embodiments of the present disclosure, and, together with the description, serve to explain principles of the present disclosure.

FIG. 6 is a diagram corresponding to FIG. 4.

DETAILED DESCRIPTION

Figure 1:
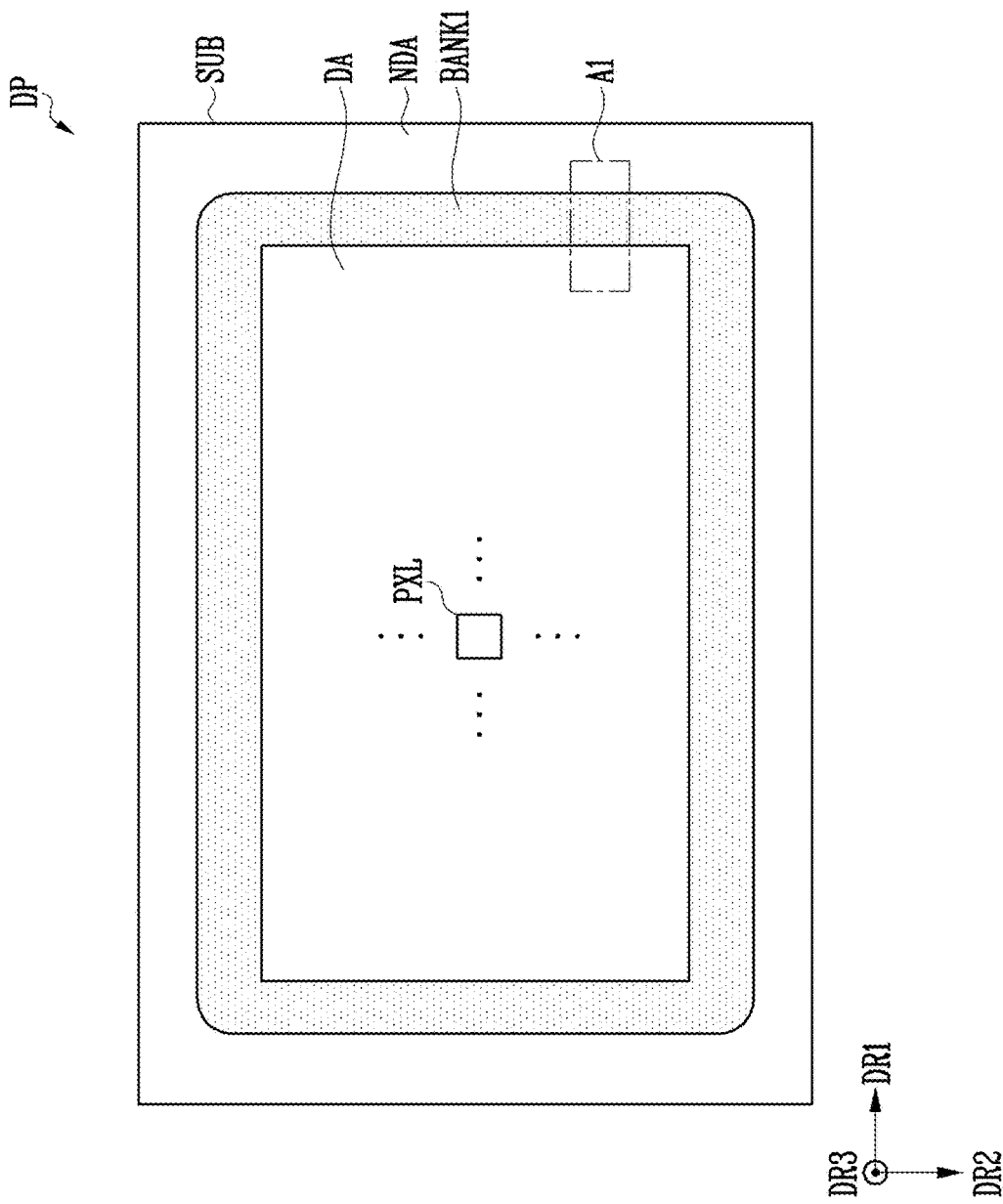
FIG. 1 is a plan view illustrating a display device according to embodiments of the present disclosure.

As the present disclosure allows for various suitable changes and numerous embodiments, particular embodiments will be illustrated in the drawings and described in more detail in the written description. However, this is not intended to limit the present disclosure to particular modes of practice or to particular embodiments, and it is to be appreciated that all suitable changes, equivalents, and substitutes that do not depart from the spirit and technical scope of the present disclosure are encompassed in the present disclosure.

As used herein, the use of the term "may," when describing embodiments of the present disclosure, refers to "one or more embodiments of the present disclosure." In describing the drawings, similar reference numerals are used for similar elements. In the accompanying drawings, the sizes of elements may be shown to be enlarged or exaggerated compared to actual embodiments for clarity of description of the present disclosure. It will be understood that, although the terms "first," "second," etc. may be used herein to describe various elements, these elements should not be limited by these terms. These terms are only used to distinguish one element from another element. For instance, a first element discussed below could be termed a second element without departing from the scope of the present disclosure. Similarly, the second element could also be termed the first element. In the disclosure, the singular forms are intended to include the plural forms as well, unless the context clearly indicates otherwise. As used herein, the term "and/or" includes any and all combinations of one or more of the associated listed items. As used herein, the term "substantially," "about," "approximately," and similar terms are used as terms of approximation and not as terms of degree, and are intended to account for the inherent deviations in measured or calculated values that would be recognized by those of ordinary skill in the art. Moreover, "about" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be further understood that the terms "comprise," "include," "have," etc. used in the disclosure, specify the presence of stated features, integers, steps, tasks, operations, elements, components, and/or combinations thereof but do not preclude the presence or addition of one or more other features, integers, steps, tasks, operations, elements, components, and/or combinations thereof. Furthermore, when a first part such as a layer, a film, a region, or a plate is disposed on a second part, the first part may be not only directly on the second part but one or more third parts may be between them. In addition, when a first part such as a layer, a film, a region, or a plate is formed on a second part, the surface of the second part on which the first part is formed is not limited to an upper surface of the second part but may include other surfaces such as a side surface or a lower surface of the second part. When a first part such as a layer, a film, a region, or a plate is under a second part, the first part may be not only directly under the second part but one or more third parts may be between them.

Hereinafter, some embodiments of the present disclosure and other matters useful for a person skilled in the art to easily understand the contents of the present disclosure will be described in more detail with reference to the accompanying drawings. In the description below, the singular expression may also include the plural expression unless the context clearly includes only the singular.

FIG. 1 is a plan view illustrating a display device according to embodiments of the present disclosure.

Referring to FIG. 1, a display device DP (or display panel) may include a substrate SUB, pixels PXL provided on the substrate SUB and including a light emitting element, a driver provided on the substrate SUB to drive the pixels PXL, and a wiring unit coupling (e.g., connecting) the pixels PXL and the driver.

The present disclosure can be applied when the display device DP is an electronic device having a display surface applied to at least one surface such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, and/or a wearable device. However, the present disclosure is not limited thereto.

The display device DP may be classified into a passive matrix type (e.g., kind) display device and an active matrix type (e.g., kind) display device according to a method of driving the light emitting element. For example, when the display device DP is implemented in an active matrix type, each of the pixels PXL may include a driving transistor that controls the amount of current supplied to the light emitting element, a switching transistor that transmits a data signal to the driving transistor, and/or the like.

The display device DP may have various suitable shapes. For example, the display device DP may have a rectangular plate shape having two pairs of sides parallel to each other, but the present disclosure is not limited thereto. When the display device DP has the rectangular plate shape, one of the two pairs of sides may be provided longer than the other pair of sides. For convenience of description, a case in which the display device DP has a rectangular shape having a pair of long sides and a pair of short sides is shown. The extension direction of the long side is indicated as a first direction DR1, the extension direction of the short side is indicated as a second direction DR2, and the direction perpendicular to the extension directions of the long side and the short side is indicated as a third direction DR3. According to an embodiment, in the display device DP having the rectangular plate shape, a corner portion where one long side and one short side contact (or meet) may have a round shape.

The substrate SUB may include a display area DA and a non-display area NDA.

The display area DA may be an area in which the pixels PXL to display an image are provided. The non-display area NDA may be an area in which the driver for driving the pixels PXL and a portion of the wiring unit coupling (e.g., connecting) the pixels PXL and the driver are provided. For convenience of description, only one pixel PXL is shown in FIG. 1, but substantially the plurality of pixels PXL may be provided in the display area DA of the substrate SUB.

The non-display area NDA may be provided on at least one side of the display area DA. The non-display area NDA may be around (e.g., surround) the periphery (or edge) of the display area DA. In the non-display area NDA, the wiring unit coupled (e.g., connected) to the pixels PXL and the driver coupled (e.g., connected) to the wiring unit to drive the pixels PXL may be provided.

The wiring unit may electrically couple (e.g., connect) the driver and the pixels PXL. The wiring unit may provide a signal to each pixel PXL and may include (e.g., be) signal lines coupled (e.g., connected) to each pixel PXL, for example, a fan-out line coupled (e.g., connected) to a scan line, a data line, an emission control line, and/or the like. In addition, the wiring unit may include (e.g., be) signal lines coupled (e.g., connected) to each pixel PXL to compensate for changes in electrical characteristics of each pixel PXL in real time, for example, a fan-out line coupled (e.g., connected) to a control line, a sensing line, and/or the like.

The substrate SUB may include (e.g., be) a transparent insulating material and may transmit light. The substrate SUB may be a rigid substrate or a flexible substrate.

One area on the substrate SUB may be provided as the display area DA where the pixels PXL are disposed, and the remaining area on the substrate SUB may be provided as the non-display area NDA.

Each of the pixels PXL may be provided in the display area DA on the substrate SUB. In one embodiment of the present disclosure, the pixels PXL may be arranged in a stripe arrangement structure or a PENTILE® (Trademark of Samsung Display Co., Ltd.) arrangement structure in the display area DA, but the present disclosure is not limited thereto. For example, the pixels PXL may be arranged in a RGBG matrix structure.

The driver may provide a set or predetermined signal and a set or predetermined power source (e.g., power) to each pixel PXL through the wiring unit to control the driving of the pixel PXL. The driver may include a scan driver, a data driver, and/or a timing controller.

In some embodiments, the display device DP may further include a first bank BANK1 provided on the non-display area NDA of the substrate SUB. The first bank BANK1 may be a structure for containing or receiving color conversion particles to be described later. A more detailed configuration of the first bank BANK1 will be described later with reference to FIGS. 2 to 6.

Figure 2:
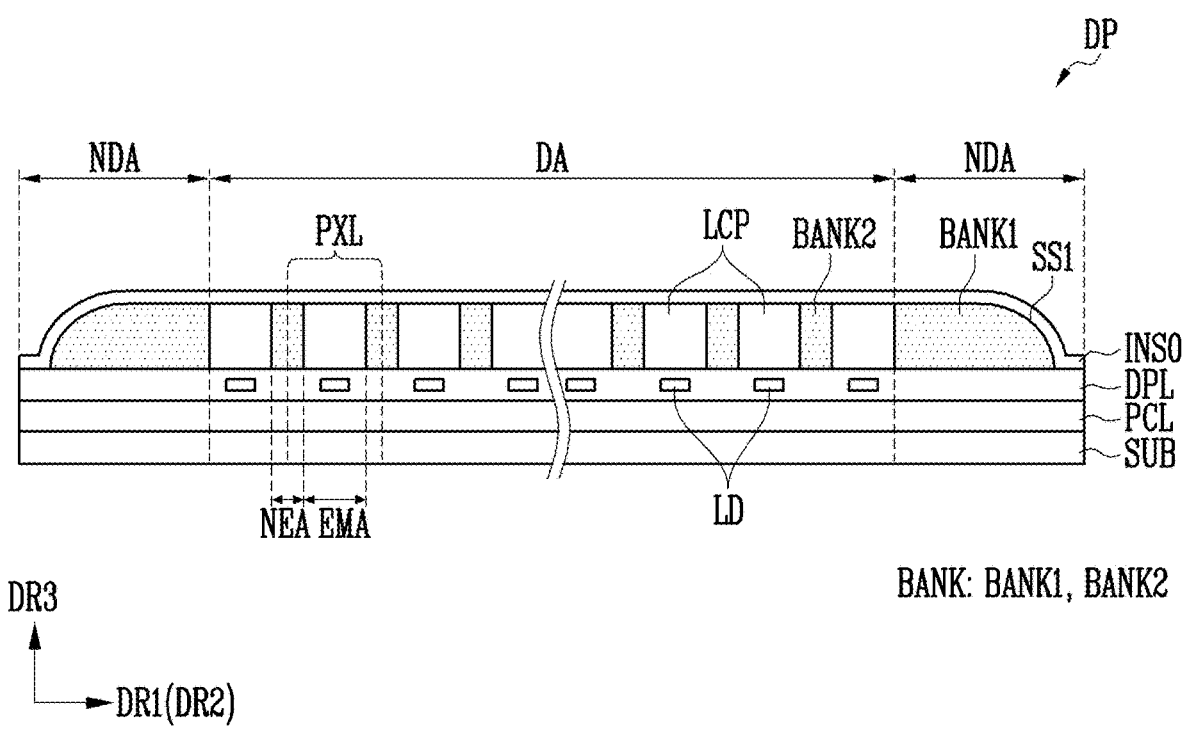
FIG. 2 is a cross-sectional view illustrating the display device of FIG. 1.
Figure 3:
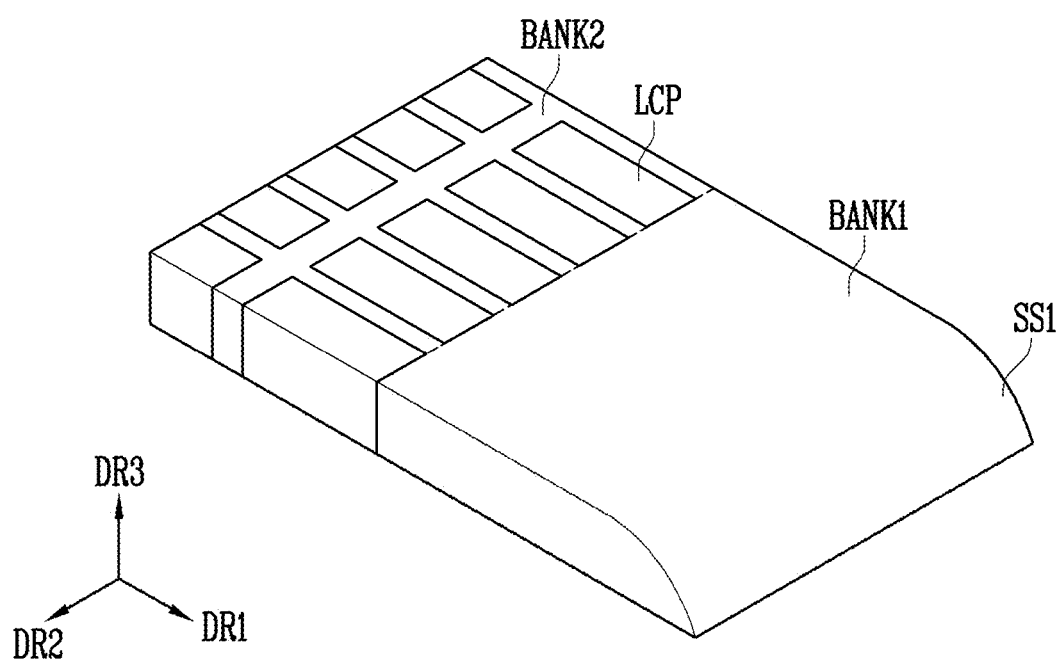
FIG. 3 is a perspective view illustrating an example of a bank included in the display device of FIG. 2.

FIG. 2 is a cross-sectional view illustrating the display device of FIG. 1. FIG. 3 is a perspective view illustrating an example of a bank included in the display device of FIG. 2. FIG. 3 shows a portion of the bank corresponding to the first area A1 of FIG. 1.

Referring to FIGS. 1, 2 and 3, the display device DP may include the substrate SUB, a pixel circuit layer PCL, a display element layer DPL, a bank BANK, a light conversion pattern layer LCP (or color conversion layer), and an organic insulating layer INS0. The pixel circuit layer PCL, the display element layer DPL, the bank BANK (and the light conversion pattern layer LCP), and the organic insulating layer INS0 may be sequentially disposed on the substrate SUB. For example, the bank BANK and the light conversion pattern layer LCP may be provided in the same layer on the display element layer DPL, and the organic insulating layer INS0 may cover the bank BANK and the light conversion pattern layer LCP.

The display area DA may include an emission area EMA and a non-emission area NEA.

The pixel circuit layer PCL may include the driver for driving the pixels PXL and the wiring unit for coupling (e.g., connecting) the pixels PXL and the driver. In addition, the pixel circuit layer PCL may include a pixel circuit of the pixel PXL (for example, the driving transistor that controls the amount of current supplied to the light emitting element LD, the switching transistor that transmits a data signal to the driving transistor, and/or the like).

The display element layer DPL may include light emitting elements LD. The light emitting elements LD may be provided in each emission area EMA. Each of the light emitting elements LD may be configured, for example, as an organic light emitting diode or an inorganic light emitting diode such as a micro light emitting diode and/or a quantum dot light emitting diode. In an embodiment, each of the light emitting elements LD may be an ultra-small, for example, as small as nano-scale to micro-scale, light emitting diode utilizing (e.g., using or being) a material having an inorganic crystal structure. The light emitting element LD may be coupled (e.g., connected) in parallel and/or in series with other light emitting elements LD disposed adjacent to each other within each pixel PXL, but the present disclosure is not limited thereto. The light emitting element LD may constitute a light source of each pixel PXL. In some embodiments, each pixel PXL may include at least one light emitting element LD driven by a set or predetermined signal (for example, the scan signal and/or the data signal) and/or a set or predetermined power source (for example, a first driving power source and/or a second driving power source).

A more detailed configuration of the display element layer DPL will be described later with reference to FIG. 11.

The bank BANK may be disposed on the display element layer DPL, and may be provided in the non-display area NDA and the non-emission area NEA. When viewed on a plane (e.g., in a plan view), the bank BANK may overlap the non-display area NDA and the non-emission area NEA of the substrate SUB, and may expose (e.g., may not overlap) the emission area EMA of the substrate SUB. The emission area EMA may be defined by the bank BANK (e.g., a second bank BANK2 and/or a first bank BANK1). For convenience of description, the bank BANK may be divided into the first bank BANK1 provided on (e.g., in) the non-display area NDA and the second bank BANK2 provided on (e.g., in) the display area DA.

A first side surface SS1 of the first bank BANK1 adjacent to an edge of the substrate SUB in the non-display area NDA may have a curved shape. However, a cross-sectional shape of the first side surface SS1 of the first bank BANK1 is not limited thereto.

In some embodiments, an average inclination angle of the first side surface SS1 of the first bank BANK1 based on an upper surface of the substrate SUB (e.g., a surface of the substrate SUB facing the first bank BANK1) may be less than or equal to about 45 degrees. Here, the average inclination angle may be an inclination angle of an imaginary line coupling (e.g., connecting) the start portion of the first side surface SS1 of the first bank BANK1 (for example, a portion where the thickness of the first bank BANK1 starts to decrease from a maximum thickness) and the end portion of the first side surface SS1 (for example, a portion where the thickness of the first bank BANK1 is minimized (e.g., a minimum thickness)). In this case, cracks may be prevented from occurring, or the occurrence of cracks may be reduced, in the organic insulating layer INS0 disposed in the non-display area NDA due to a step difference of the bank BANK1. The cracks occurring in the organic insulating layer INS0 will be described later with reference to FIG. 8.

The light conversion pattern layer LCP (or color conversion layer) may be disposed on the display element layer DPL and may overlap the emission area EMA on a plane (e.g., in a plan view). As shown in FIG. 3, an opening may be formed in the second bank BANK2 to expose the display element layer DPL corresponding to the emission area EMA, and the light conversion pattern layer LCP may be provided in the opening.

The light conversion pattern layer LCP may convert a color of light emitted from the light emitting element LD into a set or specific color. For example, the light conversion pattern layer LCP may include color conversion particles of quantum dots that convert blue light emitted from the light emitting element LD into red or green light. The color conversion particles (or the light conversion pattern layer LCP) may be supplied to the emission area EMA of each pixel PXL (e.g., supplied in the opening in the second bank BANK2) through, for example, an inkjet printing method.

In a step or task of supplying the color conversion particles to the emission area EMA, the bank BANK may function as a dam structure that prevents or blocks a solution in which the color conversion particles are mixed from flowing into the emission area EMA of an adjacent pixel PXL, and/or that controls a set or predetermined amount of the solution to be supplied to each emission area EMA.

In an embodiment, the bank BANK may include (e.g., be) an insulating material including (e.g., being) an inorganic material and/or an organic material. As an example, the bank BANK may include at least one inorganic layer including (e.g., being) various and suitable known or generally available inorganic insulating materials including silicon nitride ($SiN_x$) and/or silicon oxide ($SiO_x$). In some embodiments, the bank BANK may include at least one organic layer and/or photoresist layer including (e.g., being) various and suitable known or generally available organic insulating materials, or may be formed of a single layer or multi-layer insulator including (e.g., being) organic and/or inorganic materials in combination. According to an embodiment, the bank BANK may include a black matrix. The material constituting the bank BANK can be variously and suitably changed.

In an embodiment, the bank BANK may be configured to include (e.g., be) at least one light blocking material and/or at least one reflective material to prevent or reduce a light leakage defect in which light leaks between the pixels PXL.

The organic insulating layer INS0 may be disposed on the light conversion pattern layer LCP and the bank BANK. The organic insulating layer INS0 may be disposed on an entire surface of the substrate SUB. The organic insulating layer INS0 may be formed through a slit coating method.

The organic insulating layer INS0 may cover or seal the light conversion pattern layer LCP and the bank BANK. Accordingly, the organic insulating layer INS0 may prevent or block impurities from penetrating from outside and damaging the light conversion pattern layer LCP. According to an embodiment, the organic insulating layer INS0 may have a relatively small refractive index (index of refraction) compared to the light conversion pattern layer LCP. In this case, light obliquely incident from the light conversion pattern layer LCP to the organic insulating layer INS0 may be totally reflected due to a difference in refractive index between the light conversion pattern layer LCP and the organic insulating layer INS0, and the total reflected light may be finally (e.g., eventually) emitted in the third direction DR3 while being reflected and/or refracted inside the light conversion pattern layer LCP. Accordingly, emission efficiency of the light emitted from the pixel PXL can be improved.

In an embodiment, the organic insulating layer INS0 may include (e.g., be) an organic material such as acrylic resin, epoxy resin, phenolic resin, polyamide resin, and/or polyimide resin.

As described above, the bank BANK for controlling the supply of the light conversion pattern layer LCP may be provided on the display element layer DPL, and the average inclination angle of the first side surface SS1 of the first bank BANK1 (for example, the side surface of the first bank BANK1 adjacent to an edge of the substrate SUB) may be less than or equal to about 45 degrees. Accordingly, the cracks may be prevented from occurring, or the occurrence of cracks may be reduced, in the organic insulating layer INS0 due to the step difference of the first bank BANK1.

Figure 4:
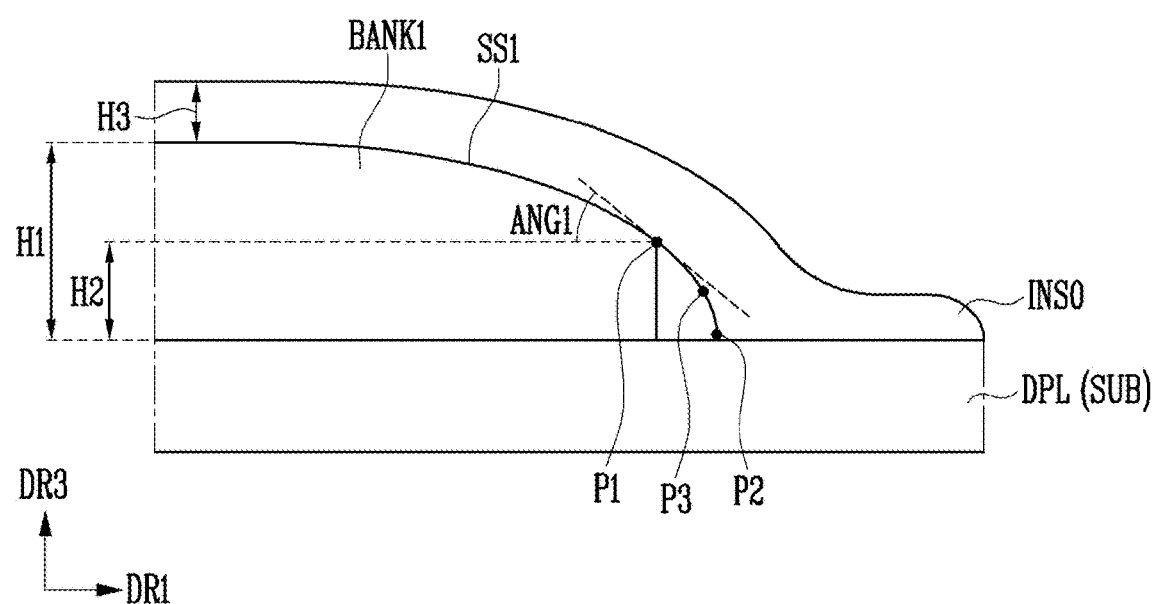
FIG. 4 is a cross-sectional view illustrating an example of the display device of FIG. 2.
Figure 5:
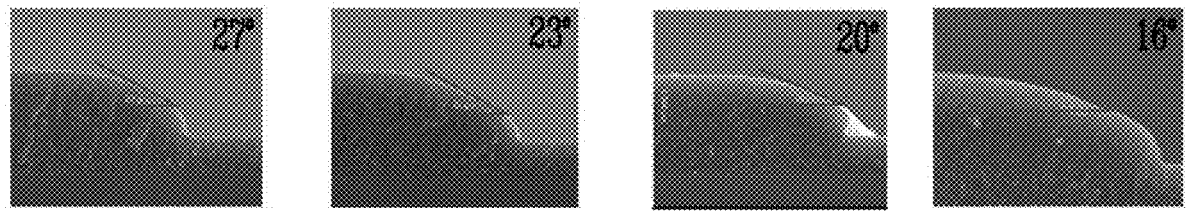
FIG. 5 is a cross-sectional view illustrating various examples of a first bank included in the display device of FIG. 4.
Figure 6:
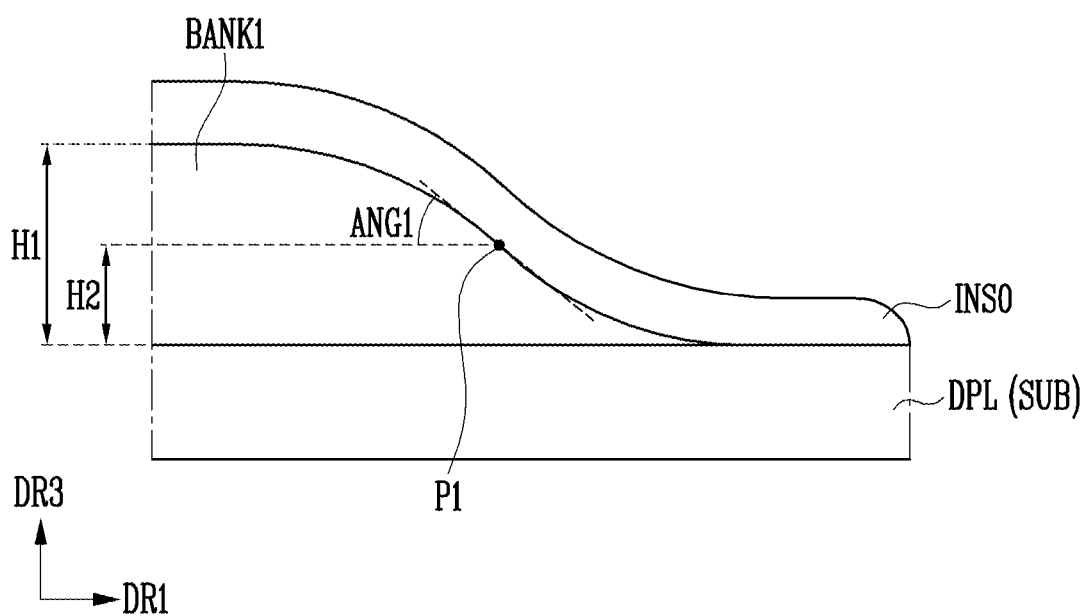
FIG. 6 is a cross-sectional view illustrating another example of the display device of FIG. 2.
Figure 7:
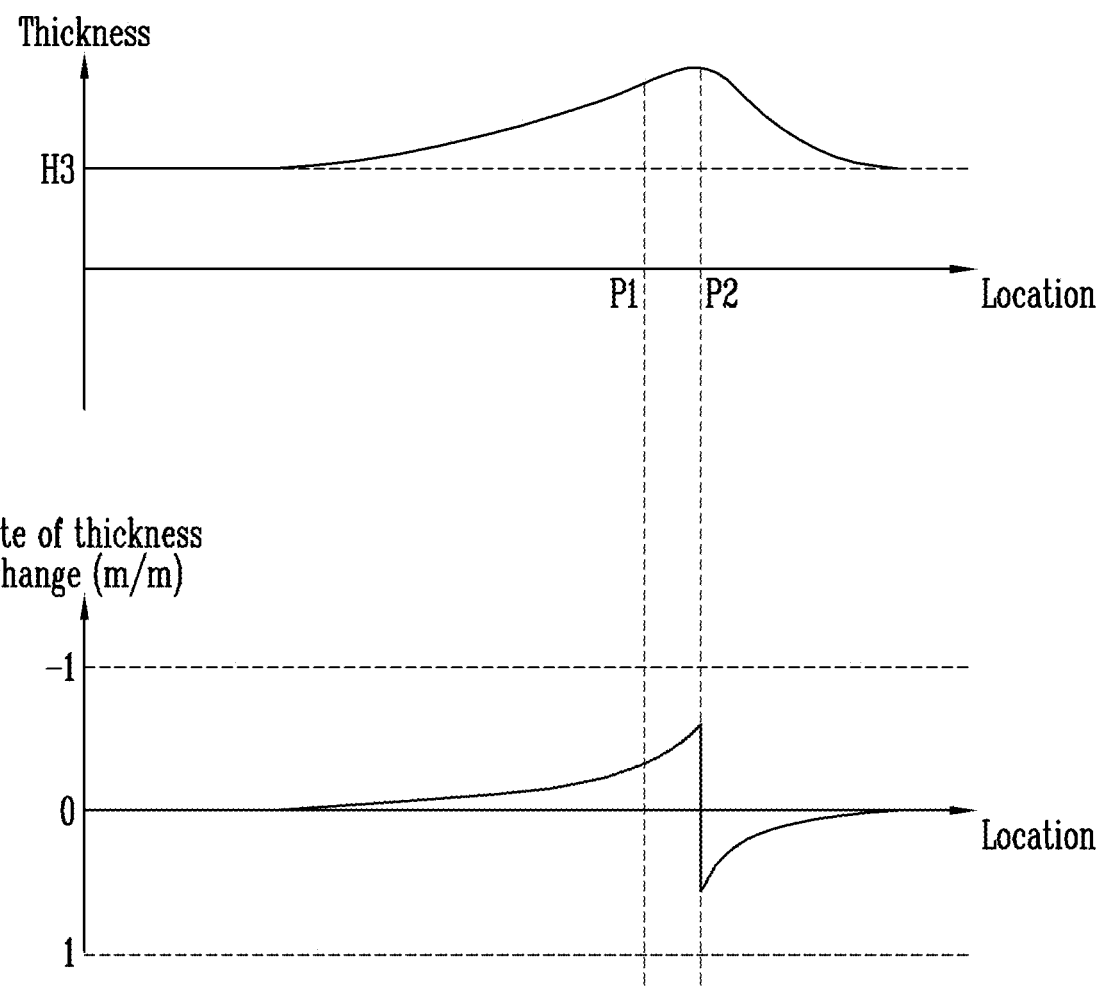
FIG. 7 shows graphs illustrating a thickness and a rate of change in thickness of an organic insulating layer included in the display device of FIG. 4.

FIG. 4 is a cross-sectional view illustrating an example of the display device of FIG. 2. FIG. 4 schematically shows the display device based on the non-display area. FIG. 5 is a cross-sectional view illustrating various examples of a first bank included in the display device of FIG. 4. FIG. 6 is a cross-sectional view illustrating another example of the display device of FIG. 2. FIG. 6 is a diagram corresponding to FIG. 4. FIG. 7 shows graphs illustrating a thickness and a rate of change in thickness of an organic insulating layer included in the display device of FIG. 4.

First, referring to FIGS. 1 to 4, a maximum thickness H1 of the first bank BANK1 may be within about 4 μm to about 20 μm. For example, the maximum thickness H1 of the first bank BANK1 may be about 10 μm. Here, the maximum thickness H1 may be a length in the third direction DR3.

In consideration of the emission efficiency of the light emitted from the pixel PXL while being emitted from the color conversion particles (for example, quantum dots) included in the light conversion pattern layer LCP described with reference to FIG. 2 and reflected and/or refracted, the light conversion pattern layer LCP may have a maximum thickness (or length) of about 10 μm. In response to this, the thickness of the bank BANK (e.g., the second bank BANK2) providing a space for accommodating the color conversion particles may be about 10 μm, and the maximum thickness H1 of the first bank BANK1 constituting an edge of the bank BANK may be about 10 μm.

The thickness of the first bank BANK1 may decrease as the distance to the edge of the display element layer DPL (or substrate SUB) decreases, and the average inclination angle of the first bank BANK1 may be less than or equal to about 45 degrees. For example, the thickness of the first bank BANK1 may decrease in a direction towards the edge of the display element layer DPL (or substrate SUB).

In some embodiments, at a first point P1 of the first side surface SS1 of the first bank BANK1, the inclination angle (for example, an inclination angle of a tangent line of the first point P1 (e.g., a tangent line of the first side surface SS1 at the first point P1) based on the upper surface of the substrate SUB (e.g., an angle between the tangent line and the upper surface of the substrate SUB)) may be less than or equal to about 45 degrees. Here, the first point P1 may be a middle point of the first side surface SS1, for example, a thickness H2 of the first bank BANK1 at the first point P1 may be equal to about ½ of the maximum thickness H1.

As shown in FIG. 4, when the first side surface SS1 of the first bank BANK1 has a curved shape, and the inclination angle of the first side surface SS1 increases as the distance to the edge of the display element layer DPL (or substrate SUB) decreases, in a section in which the thickness is greater than or equal to about ½ of the maximum thickness H1, the inclination angle of the first side surface SS1 may be less than or equal to about 45 degrees. For example, in the first side surface SS1, as the thickness of the first bank BANK1 decreases, the inclination angle at a corresponding point may increase, and a first inclination angle ANG1 at the first point P1 having a thickness of about ½ of the maximum thickness H1 may be about 45 degrees.

As shown in FIG. 5, the first inclination angle ANG1 at the first point P1 may be about 27 degrees, about 23 degrees, about 20 degrees, and about 16 degrees. When the maximum thickness H1 of the first bank BANK1 is about 4 μm, the first inclination angle ANG1 may be a maximum of about 45 degrees, and as the maximum thickness H1 of the first bank BANK1 increases, the maximum value of the first inclination angle ANG1 may decrease. For example, in the case of about 10 μm (e.g., the case when the maximum thickness H1 is about 10 μm), the first inclination angle ANG1 may be about 30 degrees or less.

In an embodiment, in a section having a thickness less than about ½ of the maximum thickness H1, the inclination angle of the first side surface SS1 may be greater than about 45 degrees. Referring to FIG. 4, for example, in the first side surface SS1, as the thickness of the first bank BANK1 decreases than the thickness H2 at the first point P1, the inclination angle may increase. For example, an inclination angle at a second point P2 in contact with the pixel circuit layer PCL (or the display element layer DPL) may be about 90 degrees, and an inclination angle at a third point P3 between the first point P1 and the second point P2 may be about 60 degrees.

In another embodiment, in the section having the thickness less than about ½ of the maximum thickness H1, the inclination angle of the first side surface SS1 may be less than or equal to about 45 degrees. Referring to FIG. 6, for example, in the first side surface SS1, as the thickness of the first bank BANK1 decreases from the thickness H2 at the first point P1, the inclination angle may decrease. For example, the first side surface SS1 has a maximum inclination angle at the first point P1, and thus, the inclination angle of the first side surface SS1 may increase as the distance to the first point P1 decreases (e.g., as the distance to the first point P1 along the first direction DR1 decreases), and may decrease as the distance from the first point P1 increases (e.g., as the distance from the first point P1 along the first direction DR1 increases). For example, the inclination angle of the first side surface SS1 may increase from the start portion of the first side surface SS1 toward the first point P1 and may decrease in a direction from the first point P1 towards the edge of the substrate SUB (or the display element layer DPL).

For reference, the organic insulating layer INS0 may cover the first bank BANK1. Also, the organic insulating layer INS0 may be disposed between the first bank BANK1 and the edge of the substrate SUB in a direction parallel to the upper surface of the substrate SUB (for example, in the first direction DR1). For example, the first bank BANK1 may not extend to the edge of the substrate SUB (or the display element layer DPL), and the organic insulating layer INS0 may extend beyond the edge of the first bank BANK1 in a direction toward the edge of the substrate SUB (or the display element layer DPL).

As shown in FIG. 7, an average thickness of the organic insulating layer INS0 at a portion in contact with the pixel circuit layer PCL (or display element layer DPL) may be the same as a third thickness H3 of the organic insulating layer INS0 at a portion in contact with an upper surface of the first bank BANK1. The third thickness H3 of the organic insulating layer INS0 at the portion in contact with the upper surface of the first bank BANK1 may be less than about ⅓ or less than about ¼ of the maximum thickness H1 of the first bank BANK1. For example, the third thickness H3 of the organic insulating layer INS0 may be several μm.

In addition, the thickness of the organic insulating layer INS0 in the third direction DR3 on the first side surface SS1 of the first bank BANK1 (for example, a distance between upper and lower surfaces of the organic insulating layer INS0 in a direction normal (e.g., perpendicular) to the upper surface of the substrate SUB) may be larger than the third thickness H3 of the organic insulating layer INS0 according to the curved shape of the first side surface SS1. However, when the inclination angle of the first side surface SS1 of the first bank BANK1 is less than about 45 degrees, the thickness of the organic insulating layer INS0 may not increase more than twice (e.g., may not increase to more than twice) the third thickness H3 of the organic insulating layer INS0. For example, the thickness of the organic insulating layer INS0 at the first point P1 may be about 1.4 times the third thickness H3 of the organic insulating layer INS0. As the inclination angle of the first side surface SS1 of the first bank BANK1 increases, the thickness of the organic insulating layer INS0 may increase. For example, in some embodiments the thickness of the organic insulating layer INS0 at the first point P1 may be about twice the third thickness H3 of the organic insulating layer INS0. In some embodiments, the thickness of the organic insulating layer INS0 at the first point P1 may be about 1.4 times the third thickness H3 of the organic insulating layer INS0, and the thickness of the organic insulating layer INS0 at the second point P2 may be about twice the third thickness H3 of the organic insulating layer INS0.

For example, as shown in FIG. 7, the size of a rate of change in thickness of the organic insulating layer INS0 along an inclined direction of the first side surface SS1 may be less than or equal to about 1. Here, the rate of change in thickness may be defined as the amount of change in thickness relative to the moving distance along the inclined direction of the first side surface SS1, and may correspond to a tangential slope of a curve indicating the thickness of the organic insulating layer INS0. For example, when the rate of change in thickness is 1, the amount of change in thickness at a point moved by 1 μm from a corresponding point may be 1 μm.

Figure 8:
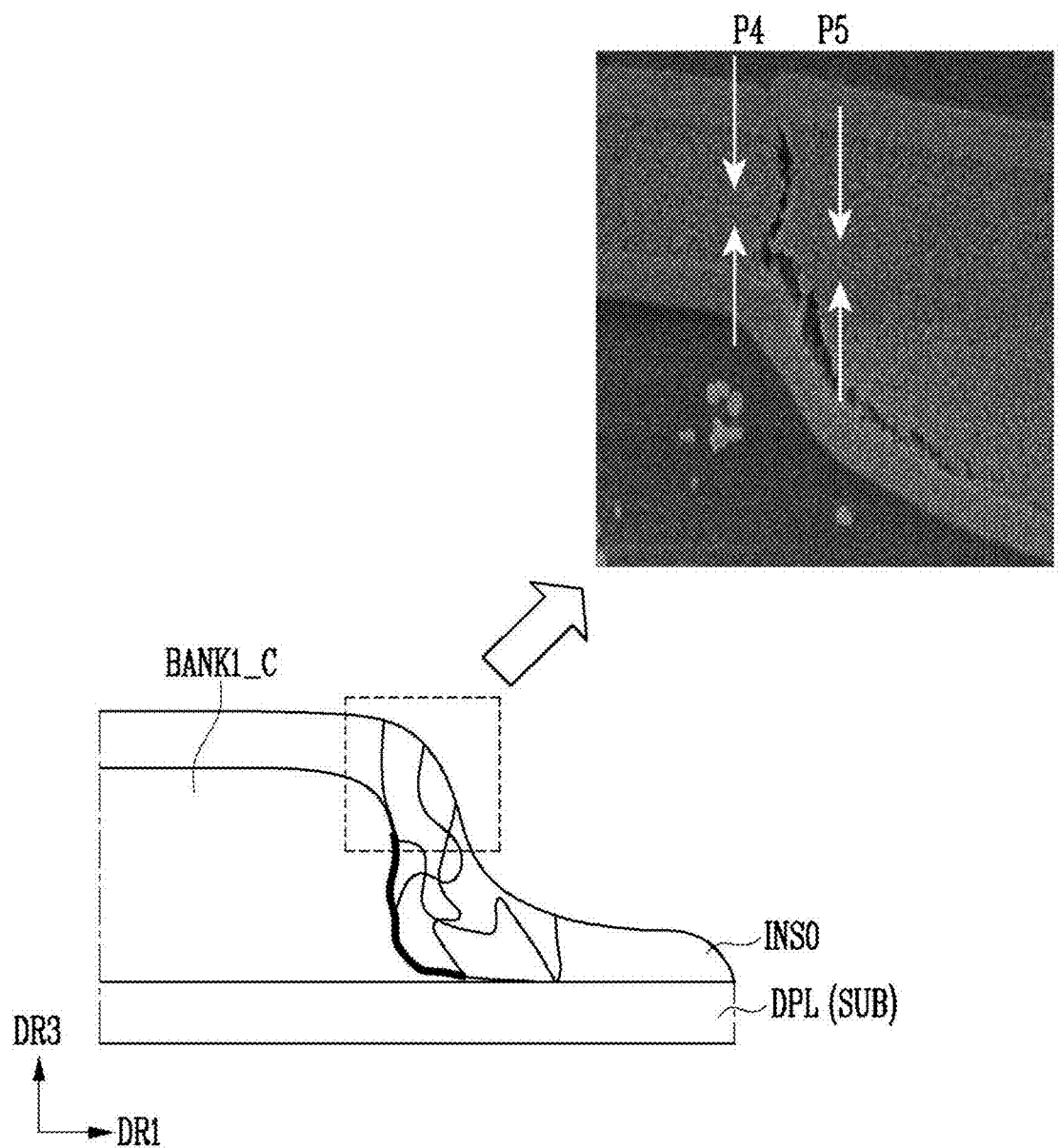
FIG. 8 is a cross-sectional view illustrating a display device according to a comparative example.

For example, when the average inclination angle of the first side surface SS1 of the first bank BANK1 is less than or equal to about 45 degrees, the thickness of the organic insulating layer INS0 may not change rapidly along the inclined direction of the first side surface SS1. In contrast, when the average inclination angle of the first side surface SS1 of the first bank BANK1 is greater than about 45 degrees, the thickness of the organic insulating layer INS0 may rapidly change along the inclined direction of the first side surface SS1. FIG. 8 may be referred to describe the abrupt change in thickness of the organic insulating layer INS0 and cracks caused by the change.

FIG. 8 is a cross-sectional view illustrating a display device according to a comparative example. FIG. 8 is a diagram corresponding to FIG. 4.

Referring to FIGS. 4 and 8, an inclination angle of a side surface of a first bank BANK1_C according to the comparative example may be greater than about 45 degrees. For example, an average inclination angle of the first bank BANK1_C may be about 60 degrees.

In this case, the thickness of the organic insulating layer INS0 may change rapidly between a fourth point P4 and a fifth point P5. Here, the fourth point P4 may be a point where the side surface of the first bank BANK1_C starts, and the fifth point P5 may be a point where the thickness of the first bank BANK1_C is about ½ of a maximum thickness. For example, the amount of change in thickness of the organic insulating layer INS0 between the fourth point P4 and the fifth point P5 may be greater than the third thickness H3 of the organic insulating layer INS0 (refer to FIG. 4). For example, as the first bank BANK1_C has a thickness (e.g., maximum thickness) of 10 μm, the thickness of the organic insulating layer INS0 may vary by several μm or more between the fourth point P4 and the fifth point P5. In the process of forming the organic insulating layer INS0, the organic insulating layer INS0 may be condensed. For example, as a solution (solvent) contained in the organic insulating layer INS0 is evaporated, the organic insulating layer INS0 may be condensed. The degree of condensation (or condensation stress) of the organic insulating layer INS0 at the fifth point P5 may be greater than twice the degree of condensation of the organic insulating layer INS0 at the fourth point P4. In this case, as the difference between condensed amounts of the organic insulating layer INS0 in the third direction DR3 at the fourth point P4 and the fifth point P5 is relatively large, the organic insulating layer INS0 may be peeled off from the first bank BANK1_C or the cracks may occur in the organic insulating layer INS0. For example, in a section in which the thickness of the organic insulating layer INS0 rapidly changes, the cracks may occur in the organic insulating layer INS0 due to a variation in condensation stress of the organic insulating layer INS0.

According to the embodiments of the present disclosure, the first side surface SS1 of the first bank BANK1 (refer to FIG. 4) may be formed to have the inclination angle (or average inclination angle) less than or equal to about 45 degrees. Accordingly, the rate of change in thickness of the organic insulating layer INS0 may be reduced, and the condensation stress (or crack stress causing the cracks in response to the variation in condensation stress) of the organic insulating layer INS0 may be dispersed. According to some embodiments of the present disclosure, when the average inclination angle of the first side surface SS1 of the first bank BANK1 is less than or equal to about 45 degrees, the rate of change of the condensation stress of the organic insulating layer INS0 may be reduced, and thus, cracking and/or peeling of the organic insulating layer INS0 may be reduced.

As described above, the maximum thickness H1 of the first bank BANK1 (or the bank BANK) may be within about 4 μm to about 20 μm in order to provide the space for accommodating the color conversion particles, and the average inclination angle of the first side surface SS1 of the first bank BANK1 may be less than or equal to about 45 degrees. Accordingly, the cracks may be prevented from occurring, or the occurrence of cracks may be reduced, in the organic insulating layer INS0 due to the step difference of the first bank BANK1.

Figure 9:
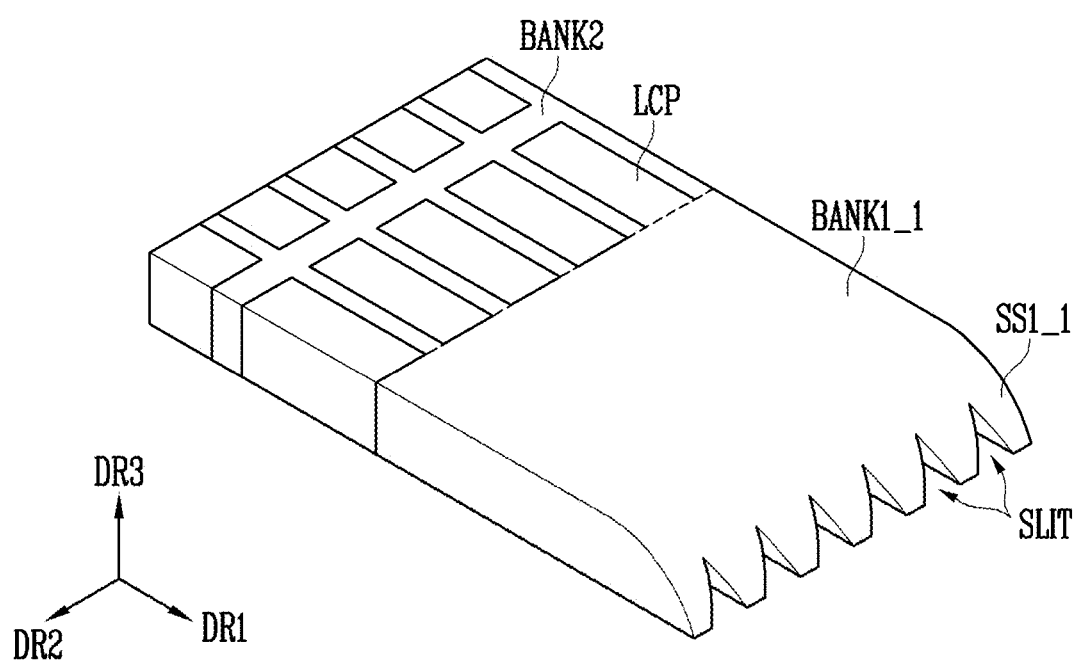
FIG. 9 is a perspective view illustrating another example of the bank included in the display device of FIG. 2.
Figure 10:
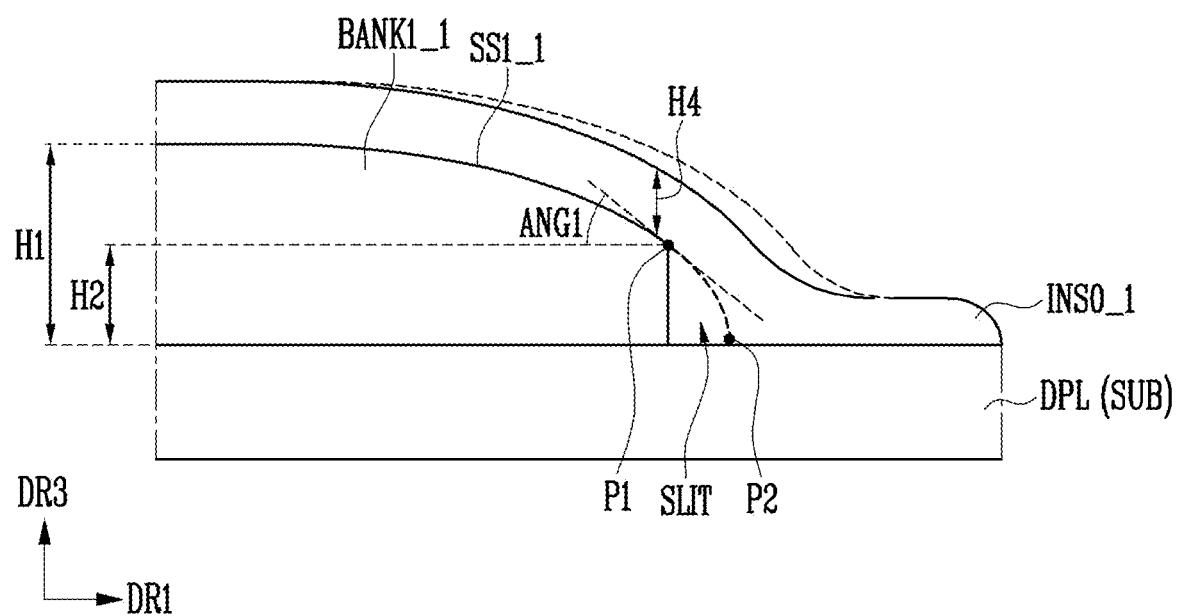
FIG. 10 is a cross-sectional view illustrating another example of the display device of FIG. 2.

FIG. 9 is a perspective view illustrating another example of the bank included in the display device of FIG. 2. FIG. 9 shows a portion of the bank corresponding to the first area A1 of FIG. 1. FIG. 10 is a cross-sectional view illustrating another example of the display device of FIG. 2. FIG. 10 is a diagram corresponding to FIG. 4.

Referring to FIGS. 1 to 4, 9, and 10, except for slits SLIT, a first bank BANK1_1 shown in FIGS. 9 and 10 may be substantially the same as or similar to the first bank BANK1 shown in FIGS. 3 and 4. Therefore, duplicate descriptions may not be provided.

The first bank BANK1_1 may include the slits SLIT formed on a first side surface SS1_1 along the second direction DR2. For example, the slits SLIT may be arranged with each other along the second direction DR2 on the first side surface SS1_1 of the first bank BANK1_1. Here, the second direction DR2 may be perpendicular to the first direction DR1, which is the shortest distance direction from the first side surface SS1_1 of the first bank BANK1_1 to the adjacent side (or edge) of the substrate SUB (e.g., a direction from a start portion of the first side surface SS1_1 towards the adjacent side (or edge) of the substrate SUB). For example, the slits SLIT may be formed on the first side surface SS1_1 of the first bank BANK1_1. In this case, an edge of the first bank BANK1_1 on a plane may have a concave and convex shape rather than a straight line shape along the second direction DR2. For example, first side surface SS1_1 of the first bank BANK1_1 may have concave shapes (e.g., indents) and convex shapes (e.g., protrusions) alternately arranged with each other along the second direction DR2.

In some embodiments, the slits SLIT may be formed in a section in which the thickness of the first bank BANK1_1 is less than about ½ of the maximum thickness H1. In some embodiments, the slits SLIT may extend from an edge of the first bank BANK1_1 (e.g., an end portion of the first bank BANK1_1) toward the start portion of the first bank BANK1_1 (e.g., in a direction of increasing thickness of the first bank BANK1_1) by a set distance that, in some embodiments, does not extend beyond where the thickness of the first bank BANK1_1 is about ½ of the maximum thickness H1. However, the present disclosure is not limited thereto. For example, in some embodiments, the set distance by which the slits SLIT extend toward the start portion of the first bank BANK1_1 may extend beyond where the thickness of the first bank BANK1_1 is about ½ of the maximum thickness H1.

As shown in FIG. 10, the slits SLIT may be formed in a section between the first point P1 and the second point P2. In this case, as an organic insulating layer INS0_1 fills the slits SLIT, the thickness of the organic insulating layer INS0_1 may be relatively reduced in a portion adjacent to the first point P1. For example, the thickness of the organic insulating layer INS0_1 may be relatively reduced compared to the height (that is, the dotted line) of the organic insulating layer INS0 described with reference to FIG. 4. For example, even in a section in which the thickness of the first bank BANK1_1 is greater than about ½ of the maximum thickness H1, a thickness H4 of the organic insulating layer INS0_1 may be relatively reduced.

In the case of the first bank BANK1 shown in FIGS. 3 and 4, the inclination angle of the first side surface SS1 may be formed smoothly only in the first direction DR1. On the other hand, in the case of the first bank BANK1_1 shown in FIGS. 9 and 10, the inclination angle of the first side surface SS1_1 may be partially formed gently (or smoothly) even in the second direction DR2 by utilizing (e.g., using) the slits SLIT. Accordingly, the condensation stress (or crack stress causing the cracks in response to the variation in condensation stress) of the organic insulating layer INS0_1 may be more dispersed.

When the slits SLIT are formed in a section in which the thickness of the first bank BANK1_1 is less than about ½ of the maximum thickness H1, the inclination angle of the first bank BANK1_1 in the slits SLIT may not be limited. For example, the inclination angle of the first bank BANK1_1 in the slits SLIT may be greater than about 45 degrees.

In contrast, when the slits SLIT are formed in a section in which the thickness of the first bank BANK1_1 is greater than about ½ of the maximum thickness H1, the inclination angle (or average inclination angle) of the first bank BANK1_1 in the slits SLIT may be less than or equal to about 45 degrees. In this case, the cracks may be prevented from occurring, or the occurrence of cracks may be reduced, in the organic insulating layer INS0_1 due to the slits SLIT.

As described above, the first bank BANK1_1 may include the slits SLIT formed on the first side surface SS1_1 along the second direction DR2. Accordingly, the condensation stress (or crack stress causing the cracks in response to the variation in condensation stress) of the organic insulating layer INS0_1 may be dispersed in not only the first direction DR1 but also the second direction DR2, and the cracks may be prevented from occurring, or the occurrence of cracks may be reduced, in the organic insulating layer INS0_1.

Figure 11:
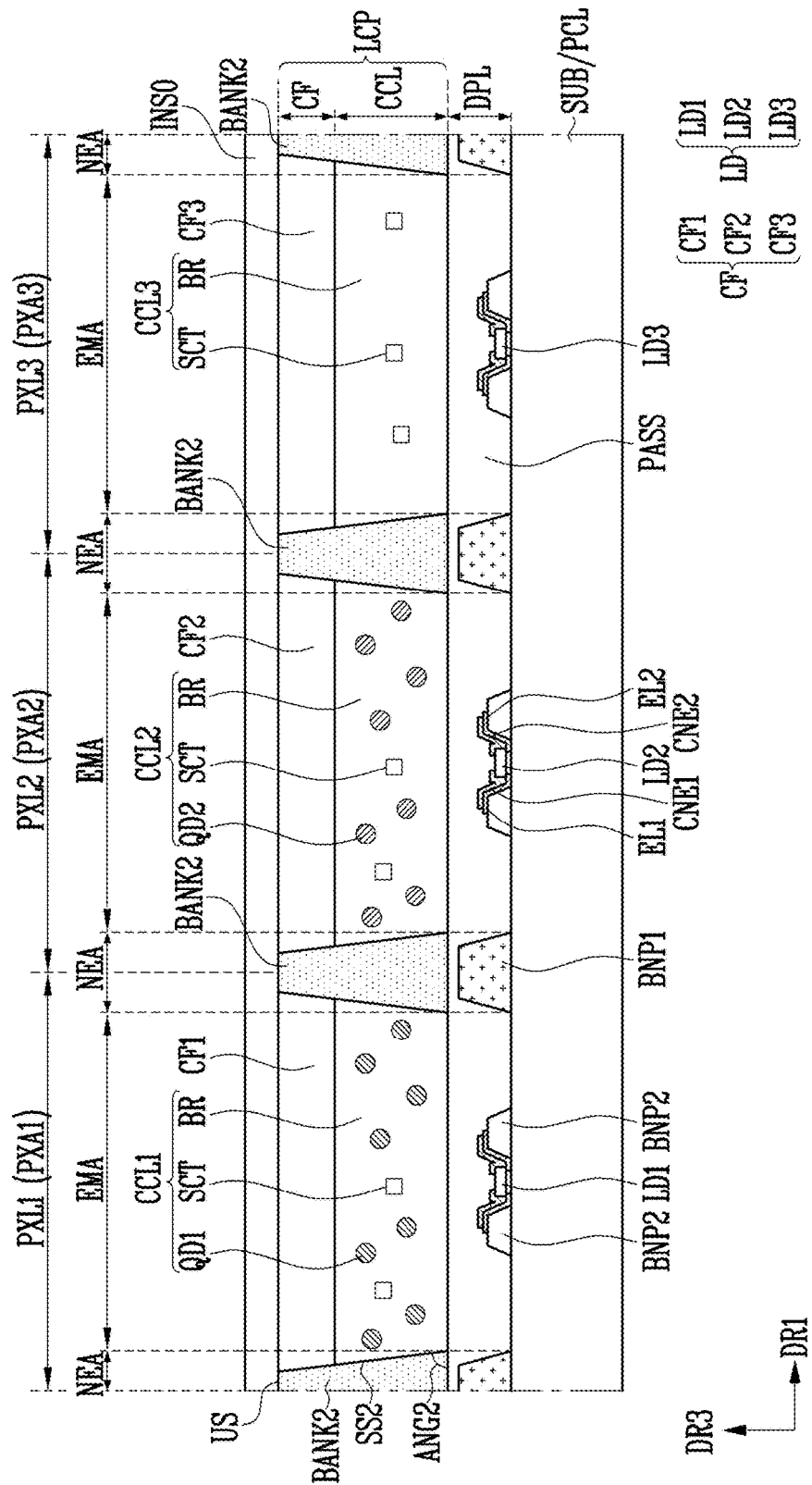
FIG. 11 is a cross-sectional view illustrating an example of the display device of FIG. 2.

FIG. 11 is a cross-sectional view illustrating an example of the display device of FIG. 2. FIG. 11 schematically shows the display device based on the display area.

Referring to FIGS. 1, 2 and 11, a first pixel PXL1, a second pixel PXL2, and a third pixel PXL3 may be disposed on the substrate SUB. The first to third pixels PXL1, PXL2, and PXL3 may constitute one unit pixel, but the present disclosure is not limited thereto.

According to an embodiment, the first to third pixels PXL1, PXL2, and PXL3 may emit light of different colors. For example, the first pixel PXL1 may be a red pixel to emit red light, the second pixel PXL2 may be a green pixel to emit green light, and the third pixel PXL3 may be a blue pixel to emit blue light. However, the color, type (e.g., kind), and/or number of pixels constituting the unit pixel are not particularly limited. As an example, the color of light emitted by each of the pixels may be variously and suitably changed. According to an embodiment, the first to third pixels PXL1, PXL2, and PXL3 may emit light of the same color. For example, each of the first to third pixels PXL1, PXL2, and PXL3 may be blue pixels to emit blue light.

In the embodiments of the present disclosure, unless stated otherwise, the expression "formed and/or provided on the same layer" may refer to being formed in the same process, and the expression "formed and/or provided on a different layer" may refer to being formed in a different process.

The display element layer DPL, the light conversion pattern layer LCP, and the organic insulating layer INS0 may be sequentially disposed on the substrate SUB. For convenience of description, the pixel circuit layer PCL is shown together with the substrate SUB. However, as described with reference to FIG. 2, the pixel circuit layer PCL may be disposed between the substrate SUB and the display element layer DPL.

The display element layer DPL may include a first bank pattern BNP1. The first bank pattern BNP1 may be positioned in the non-emission area NEA of the first to third pixels PXL1, PXL2, and PXL3. The first bank pattern BNP1 may be formed between the first to third pixels PXL1, PXL2, and PXL3 to be around (e.g., surround) each emission area EMA, and the first bank pattern BNP1 may be a pixel defining layer defining (or partitioning) the emission area EMA of each of the first to third pixels PXL1, PXL2, and PXL3. In a step or task of supplying the light emitting elements LD to the emission area EMA, the first bank pattern BNP1 may function as a dam structure that prevents or blocks a solution in which the light emitting elements LD are mixed from flowing into the emission area EMA of an adjacent pixel PXL, and/or that controls a set or predetermined amount of the solution to be supplied to each emission area EMA.

The first bank pattern BNP1 may include (e.g., be) an insulating material including (e.g., being) an inorganic material and/or an organic material.

In an embodiment, the first bank pattern BNP1 may be configured to include (e.g., be) at least one light blocking material and/or at least one reflective material to prevent or reduce a light leakage defect in which light leaks between the first to third pixels PXL1, PXL2, and PXL3. According to an embodiment, the first bank pattern BNP1 may include (e.g., be) a transparent material. The transparent material may include (e.g., be), for example, a polyamide resin, a polyimide resin, and/or the like. However, the present disclosure is not limited thereto. According to another embodiment, a reflective material layer may be provided and/or formed on the first bank pattern BNP1 to further improve emission efficiency of light emitted from the first to third pixels PXL1, PXL2, and PXL3.

The display element layer DPL may include a second bank pattern BNP2, first and second electrodes EL1 and EL2, a light emitting element LD, first and second contact electrodes CNE1 and CNE2, and a passivation layer PASS provided in each emission area EMA.

The second bank pattern BNP2 may have a shape protruding in the third direction DR3, and the first electrode EL1 and the second electrode EL2 may be arranged on the second bank pattern BNP2. The first electrode EU and the second electrode EL2 may be disposed to be spaced apart from each other in the first direction DR1.

Each of the first electrode EL1 and the second electrode EL2 may be a light guide member (or reflective member) that is to guide the light emitted from the light emitting elements LD in the third direction DR3 (or a direction in which an image is to be displayed on the display device). To this end, each of the first electrode EU and the second electrode EL2 may be formed of a conductive material having a constant reflectance. The conductive material may include (e.g., be) an opaque metal. For example, the opaque metal may include (e.g., be) metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. According to an embodiment, each of the first electrode EL1 and the second electrode EL2 may include (e.g., be) a transparent conductive material. The transparent conductive material may include (e.g., be) a conductive oxide such as indium tin oxide (ITO), indium zinc oxide (IZO), zinc oxide (ZnO), indium gallium zinc oxide (IGZO), and/or indium tin zinc oxide (ITZO), and/or a conductive polymer such as PEDOT (poly(3,4-ethylenedioxythiophene). When each of the first electrode EL1 and the second electrode EL2 includes the transparent conductive material, a separate conductive layer made of the opaque metal may be added to reflect the light emitted from the light emitting elements LD in the third direction DR3.

The light emitting element LD may be disposed on the first and second electrodes EL1 and EL2 between adjacent second bank patterns BNP2. For example, a first light emitting element LD1 may be provided in a first pixel area PXA1, a second light emitting element LD2 may be provided in a second pixel area PXA2, and a third light emitting element LD3 may be provided in a third pixel area PXA3.

The light emitting element LD may be an ultra-small, for example, as small as nano-scale to micro-scale, light emitting diode utilizing (e.g., using) a material having an inorganic crystal structure. For example, the light emitting element LD may include a first semiconductor layer, a second semiconductor layer, an active layer, and an insulating layer. The first semiconductor layer may include a semiconductor layer having a set or predetermined type (e.g., kind), and the second semiconductor layer may include a semiconductor layer having a type (e.g., kind) different from that of the first semiconductor layer. For example, the first semiconductor layer may include an N-type (e.g., N-doped) semiconductor layer, and the second semiconductor layer may include a P-type (e.g., P-doped) semiconductor layer. The first semiconductor layer and the second semiconductor layer may include (e.g., be) at least one semiconductor material selected from InAlGaN, GaN, AlGaN, InGaN, AlN, and InN. The active layer may be positioned between the first semiconductor layer and the second semiconductor layer, and may have a single or multiple quantum well structure. When an electric field of a set or predetermined voltage (or a higher voltage) is applied to both ends of the light emitting element LD, electron-hole pairs are coupled in the active layer and light may be emitted.

At least two to tens of light emitting elements LD may be aligned and/or provided in the emission area EMA. However, the number of light emitting elements LD arranged and/or provided in the emission area EMA is not limited thereto. According to an embodiment, the number of light emitting elements LD arranged and/or provided in the emission area EMA may be variously and suitably changed.

Each of the light emitting elements LD may emit light of color light and/or white light. In an embodiment, each of the light emitting elements LD may emit blue light in a short wavelength range, but the present disclosure is not limited thereto.

The first contact electrode CNE1 and the second contact electrode CNE2 may be disposed on the light emitting element LD. The first contact electrode CNE1 and the second contact electrode CNE2 may be electrically coupled (e.g., connected) to the first electrode EL1 and the second electrode EL2, respectively.

The first contact electrode CNE1 and the second contact electrode CNE2 may include (e.g., be) at least one selected from conductive materials including (e.g., being) indium tin oxide (ITO), indium zinc oxide (IZO), and indium tin zinc oxide (ITZO).

An electrical signal provided through the first electrode EU may be provided to an end of the light emitting element LD through the first contact electrode CNE1, and an electrical signal provided through the second electrode EL2 may be provided to another end of the light emitting element LD through the second contact electrode CNE2. The light emitting element LD may emit light based on the electrical signals.

The passivation layer PASS may be disposed on the first bank pattern BNP1, the second bank pattern BNP2, the first contact electrode CNE1, and the second contact electrode CNE2. According to an embodiment, the passivation layer PASS may be disposed on the entire surface of the substrate SUB. The passivation layer PASS may include (e.g., be) at least one selected from an organic material and an inorganic material, and may protect the display element layer DPL from external influences.

The second bank BANK2 may be disposed on the display element layer DPL.

The second bank BANK2 may be positioned in the non-emission area NEA of the first to third pixels PXL1, PXL2, and PXL3. The second bank BANK2 may be formed between the first to third pixels PXL1, PXL2, and PXL3 to be around (e.g., surround) each emission area EMA, and may define the emission area EMA of each of the first to third pixels PXL1, PXL2, and PXL3. The second bank BANK2 may function as a dam structure that prevents or blocks a solution for forming the color conversion layer CCL in the emission area EMA from flowing into the emission area EMA of an adjacent pixel PXL, and/or that controls a set or predetermined amount of the solution to be supplied to each emission area EMA.

In an embodiment, the second bank BANK2 may completely overlap the first bank pattern BNP1 on a plane (e.g., in a plan view). However, the present disclosure is not limited thereto. In consideration of the direction in which the light emitted from the light emitting elements LD travels (and the direction in which the light is reflected by the first bank pattern BNP1), the width of the second bank BANK2 in the first direction DR1 in the non-emission area NEA may be smaller than the width of the first bank pattern BNP1.

As described with reference to FIG. 4, the thickness (or maximum thickness) of the second bank BANK2 may be about 4 μm to about 20 μm, for example, the thickness of the second bank BANK2 may be about 10 μm.

An opening exposing the display element layer DPL may be formed in the second bank BANK2 to correspond to the emission area EMA.

In an embodiment, an inclination angle ANG2 of a second side surface SS2 of the second bank BANK2 constituting the opening may be greater than about 45 degrees. In some embodiments, the inclination angle ANG2 of the second side surface SS2 may be defined by an angle between the upper surface of the display element layer DPL (or an upper surface of a layer that the second bank BANK2 is on) and the second side surface SS2. For example, the inclination angle of the second side surface SS2 of the second bank BANK2 may be about 80 degrees to about 90 degrees. As will be described later, because the organic insulating layer INS0 only contacts an upper surface US of the second bank BANK2 and hardly contacts the second side surface SS2 of the second bank BANK2, the inclination angle of the second side surface SS2 of the second bank BANK2 may be set regardless of the change in thickness of the organic insulating layer INS0.

The light conversion pattern layer LCP may be disposed in each opening of the second bank BANK2.

The light conversion pattern layer LCP may include a color conversion layer CCL and a color filter CF (or a color filter layer) corresponding to a set or predetermined color.

The color conversion layer CCL may include a base resin BR, color conversion particles QD1 and QD2, and light scattering particles SCT.

The base resin BR may have high light transmittance and excellent dispersion characteristics for the color conversion particles QD1 and QD2. For example, the base resin BR may include (e.g., be) an organic material such as an epoxy resin, an acrylic resin, a cardo resin, and/or an imide resin.

The color conversion particles QD1 and QD2 may convert the color of light emitted from the light emitting elements LD disposed in one pixel into a set or specific color. For example, when the first pixel PXL1 is the red pixel, a first color conversion layer CCL1 may include color conversion particles QD1 of red quantum dots that convert light emitted from first light emitting elements LD1 into red light. As another example, when the second pixel PXL2 is the green pixel, a second color conversion layer CCL2 may include color conversion particles QD2 of green quantum dots that convert light emitted from second light emitting elements LD2 into green light. As still another example, when the third pixel PXL3 is the blue pixel, a third color conversion layer CCL3 may include color conversion particles of blue quantum dots that convert light emitted from third light emitting elements LD3 into blue light. In contrast, when the third light emitting elements LD3 emit blue light, the third color conversion layer CCL3 may not include the color conversion particles.

The light scattering particles SCT may have a refractive index different from that of the base resin BR, and may form an optical interface with the base resin BR. The light scattering particles SCT may be metal oxide particles or organic particles. According to some embodiments, the light scattering particles SCT are not included.

The color filter CF may be disposed between the color conversion layer CCL and the organic insulating layer INS0, and may include (e.g., be) a color filter material that selectively transmits light of a set or specific color converted by the color conversion layer CCL. The color filter CF may include a red color filter, a green color filter, and a blue color filter. For example, when the first pixel PXL1 is the red pixel, a first color filter CF1 that transmits red light may be disposed on the first pixel PXL1. When the second pixel PXL2 is the green pixel, a second color filter CF2 that transmits green light may be disposed on the second pixel PXL2. When the third pixel PXL3 is the blue pixel, a third color filter CF3 that transmits blue light may be disposed on the third pixel PXL3.

The organic insulating layer INS0 may be disposed on the second bank BANK2 and the light conversion pattern layer LCP.

As shown in FIG. 11, the light conversion pattern layer LCP may be provided in the opening of the second bank BANK2 to substantially cover the second side surface SS2 of the second bank BANK2. In this case, the organic insulating layer INS0 may contact the upper surface US of the second bank BANK2 and may hardly contact (e.g., may not contact) the second side surface SS2 of the second bank BANK2. In the display area DA (refer to FIG. 2), because the step difference does not substantially occur in the organic insulating layer INS0, a change in thickness of the organic insulating layer INS0 may not occur significantly. Therefore, in order for the second bank BANK2 to have a thickness of about 4 μm to about 20 μm within the limited pixel area (for example, the first pixel area PXA1), the inclination angle of the second side surface SS2 of the second bank BANK2 may be greater than about 45 degrees.

As described above, in the display area DA (refer to FIG. 2), the second bank BANK2 and the light conversion pattern layer LCP may be disposed on the display element layer DPL, and the organic insulating layer INS0 may be disposed to cover the second bank BANK2 and the light conversion pattern layer LCP. Because the step difference due to the second bank BANK2 and the light conversion pattern layer LCP does not substantially occur, the organic insulating layer INS0 may have a substantially uniform thickness. Accordingly, the inclination angle of the second side surface SS2 of the second bank BANK2 may be set to be greater than about 45 degrees without taking into account the change in thickness of the organic insulating layer INS0 (and occurrence of the cracks).

In the display device according to the embodiments of the present disclosure, the bank having the thickness of about 4 μm to about 20 μm may be provided to control the supply of the color conversion layer on the substrate, and the inclination angle of the first side surface of the bank (for example, the side surface adjacent to the edge of the substrate) may be less than or equal to about 45 degrees. Therefore, the rate of change in thickness of the organic insulating layer disposed on the first side surface of the bank may be reduced and the condensation stress of the organic insulating layer may be dispersed. Accordingly, the cracks may be prevented from occurring, or the occurrence of cracks may be reduced, in the organic insulating layer due to the step difference of the bank.

Aspects and features that can be obtained by the embodiments of the present disclosure are not limited to the above-described aspects and features, and more various and suitable aspects and features are included in the present specification.

Some embodiments of the present disclosure have been described above with reference to the accompanying drawings. However, those skilled in the art or those of ordinary skill in the art to which the present disclosure pertains will appreciate that various suitable modifications and changes can be made to the present disclosure without departing from the spirit and technical scope of the present disclosure described in the following claims and equivalents thereof.

Therefore, the technical protection scope of the present disclosure is not limited to the content described in the detailed description of the specification, but should be defined by the appended claims and equivalents thereof.

What is claimed is:

1. A display device comprising:
    a substrate comprising a non-display area and a display area, the display area comprising an emission area and a non-emission area;
    a display element layer comprising a light emitting element on the emission area of the substrate;
    a bank on the display element layer and overlapping the non-display area and the non-emission area of the substrate in a plan view;
    a color conversion layer on the display element layer, overlapping the emission area in the plan view, and to convert a color of light emitted from the light emitting element; and
    an organic insulating layer on the color conversion layer and the bank,
    wherein a maximum thickness of the bank is about 4 μm to about 20 μm, and
    wherein an average inclination angle of a first side surface of the bank adjacent to an edge of the substrate in the non-display area with respect to an upper surface of the substrate is less than or equal to about 45 degrees.

2. The display device of claim 1, wherein an inclination angle, with respect to the upper surface of the substrate and at a first point of the first side surface of the bank having a thickness greater than or equal to about ½ of the maximum thickness, is less than or equal to about 45 degrees.

3. The display device of claim 2, wherein an inclination angle, with respect to the upper surface of the substrate and at a second point of the first side surface of the bank having a thickness less than about ½ of the maximum thickness, is greater than about 45 degrees.

4. The display device of claim 2, wherein an inclination angle, with respect to the upper surface of the substrate and at a second point of the first side surface of the bank having a thickness less than about ½ of the maximum thickness, is less than or equal to about 45 degrees.

5. The display device of claim 4, wherein an inclination angle of the first side surface of the bank increases as a distance from the first point decreases along a first direction towards the edge of the substrate, and the inclination angle of the first side surface of the bank decreases as the distance from the first point increases along the first direction towards the edge of the substrate.

6. The display device of claim 1, wherein the organic insulating layer covers the bank, and
wherein only the organic insulating layer is between the bank and the edge of the substrate in a direction parallel to the upper surface of the substrate.

7. The display device of claim 1, wherein a size of a rate of change in thickness of the organic insulating layer along an inclined direction of the first side surface of the bank in the non-display area is less than or equal to about 1, and
wherein the thickness of the organic insulating layer is a distance between upper and lower surfaces of the organic insulating layer in a direction normal to the upper surface of the substrate.

8. The display device of claim 1, wherein the bank has slits formed on the first side surface along a second direction, and
wherein the second direction is perpendicular to a first direction, the first direction being from the first side surface of the bank to an adjacent side of the substrate.

9. The display device of claim 8, wherein the slits are formed in a section of the bank in which a thickness of the bank is less than about ½ of the maximum thickness of the bank.

10. The display device of claim 1, wherein the bank has an opening corresponding to the emission area in the display area, and
wherein an inclination angle of a second side surface of the bank forming the opening is greater than about 45 degrees.

11. The display device of claim 10, wherein the color conversion layer is provided in the opening of the bank and covers the second side surface of the bank.

12. The display device of claim 11, wherein the organic insulating layer does not contact the second side surface of the bank in the display area.

13. The display device of claim 11, further comprising:
a color filter provided in the opening of the bank between the color conversion layer and the organic insulating layer.

14. The display device of claim 11, wherein the display element layer further comprises a bank pattern defining the emission area, and
wherein the bank completely overlaps the bank pattern in the plan view in the display area.

15. The display device of claim 14, wherein the display element layer further comprises a passivation layer covering the light emitting element and the bank pattern, and
wherein the bank is on the passivation layer.

* * * * *